US006293007B1

(12) United States Patent
Kuriyama et al.

(10) Patent No.: US 6,293,007 B1
(45) **Date of Patent: *Sep. 25, 2001**

(54) MOUNTING SYSTEM

(75) Inventors: Tokio Kuriyama; Masao Tomioka, both of Kajang (MY)

(73) Assignee: Sony Video (M) SDN. BHD., Kajang (MY)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/865,229

(22) Filed: May 29, 1997

(30) Foreign Application Priority Data

May 30, 1996 (MY) .......................................... PI 960 2071

(51) Int. Cl.$^{7}$ ....................................................... H05K 3/34

(52) U.S. Cl. ............................ 29/840; 29/564.1; 29/712; 29/742; 29/759

(58) Field of Search ............................. 29/840, 740, 759, 29/760, 712, 741, 564.1, 742, 783, 794

(56) References Cited

U.S. PATENT DOCUMENTS

| | | | |
|---|---|---|---|
| 3,722,062 | 3/1973 | Gharaibeh . | |
| 3,803,908 * | 4/1974 | Endo et al. | 73/100 |
| 4,383,359 * | 5/1983 | Suzuki et al. | 29/712 |
| 4,586,613 * | 5/1986 | Horii | 209/556 |
| 4,635,574 * | 1/1987 | Fujita et al. | 112/121.12 |
| 4,667,403 | 5/1987 | Edinger et al. | 29/840 |
| 4,681,231 * | 7/1987 | Ueda et al. | 209/656 |
| 4,964,211 * | 10/1990 | Arao et al. | 29/705 |
| 5,027,295 * | 6/1991 | Yotsuya | 364/552 |
| 5,140,646 | 8/1992 | Ueda | 382/22 |
| 5,208,969 * | 5/1993 | Hidese | 29/740 |
| 5,226,361 * | 7/1993 | Grant et al. | 101/44 |
| 5,262,954 * | 11/1993 | Fujino et al. | 364/468 |
| 5,325,582 | 7/1994 | Glaser et al. | 29/840 |
| 5,565,789 | 10/1996 | Schaller | 324/764 |
| 5,672,858 * | 9/1997 | Li et al. | 367/468 |
| 5,740,729 * | 4/1998 | Hikita et al. | 101/126 |
| 5,743,005 * | 4/1998 | Nakao et al. | 29/833 |
| 6,002,650 * | 12/1999 | Kuribayashi et al. | 367/468.24 |

FOREIGN PATENT DOCUMENTS

| | | |
|---|---|---|
| 0341806 | 11/1989 | (EP) . |
| 0810817-A2 * | 12/1997 | (EP) . |

OTHER PUBLICATIONS

Patent Abstracts of Japan, vol. 010, No. 160 (P–465), JP 61–014549 A (Fujitsu KK), Jan. 22, 1986.

Patent Abstract of Japan, vol. 010, No. 127 (P–455), JP 60–253854 A (Toshiba KK), Dec. 14, 1985.

* cited by examiner

*Primary Examiner*—Lee Young
*Assistant Examiner*—Minh Trinh
(74) *Attorney, Agent, or Firm*—Frommer Lawrence & Haug LLP.; William S. Frommer; Matthew K. Ryan

(57) ABSTRACT

In a mounting system including a loading station having a transport conveyer for conveying printed circuit boards, a mounting machine for fabricating circuit devices by attaching electronic assemblies on printed circuit boards supplied thereto from said loading station, and an unloading station having a transport conveyor for conveying circuit devices supplied thereto from the mounting machine, the loading station includes a discriminating device for discriminating the kind or type of printed circuit boards and for generating a discrimination signal for instructing the kind or type of the printed circuit board. A mounting process in the mounting machine is selectively set by the discrimination signal from the discriminating device. According to this mounting system, even when many kinds of circuit devices are fabricated by many kinds of printed circuit boards, mounting processes can be successively carried out by one mounting line.

5 Claims, 13 Drawing Sheets

18
14
50
12
16
10
20
32
52
60
36
30

10
16
50
50A
50B
16
230
50
Y
X
O
50A
231
50B
231
232
235
233
236
237
238

50-2
50A
50B
232
233
234

50-1
50A
50B
50C
232
233
234

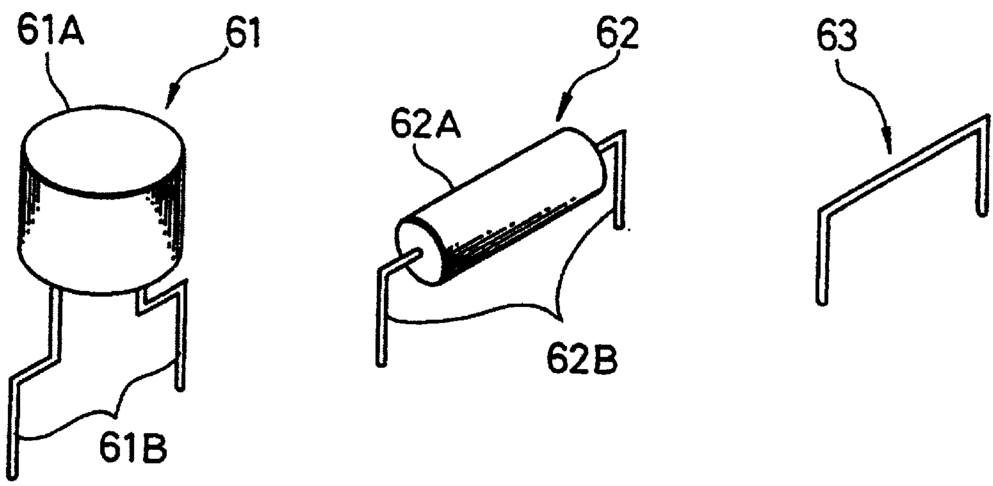
F I G. 8A
F I G. 8B
F I G. 8C
61A
61
61B
62
62A
62B
63
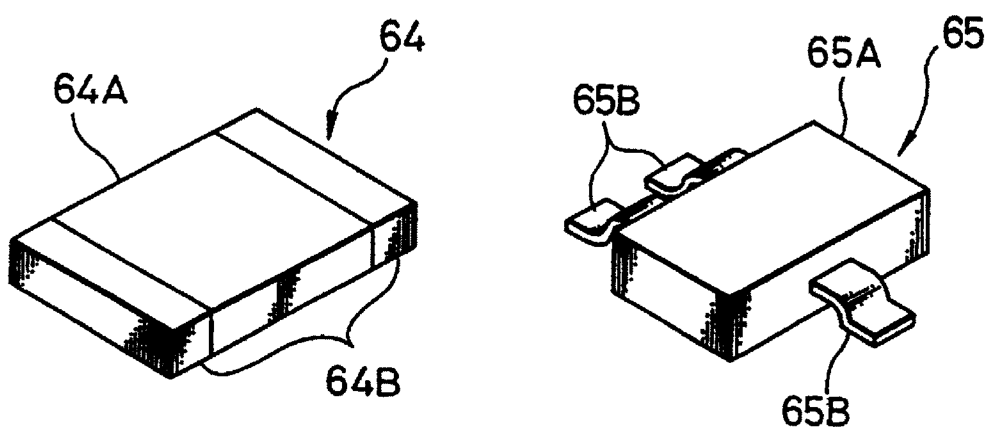
F I G. 8D
F I G. 8E
64
64A
64B
65B
65A
65
65B F I G. 12A
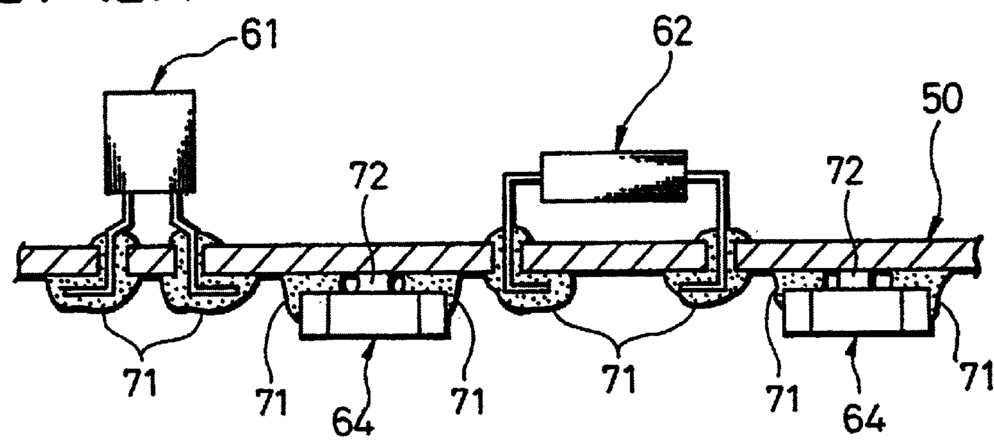
F I G. 12B
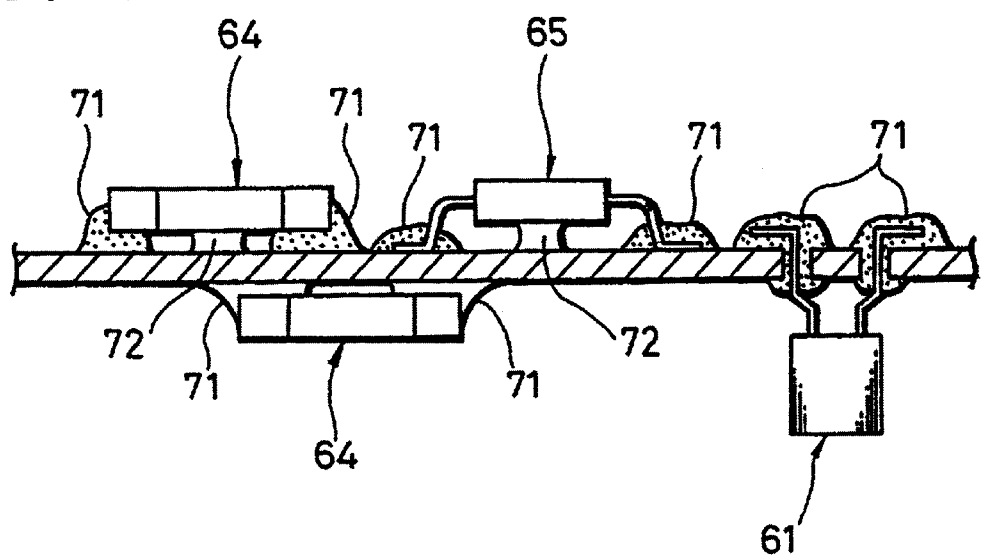
F I G. 12C
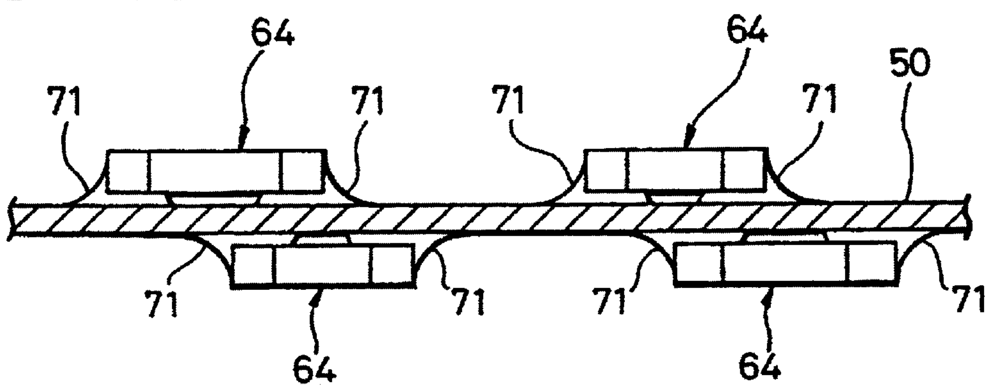

MOUNTING SYSTEM

BACKGROUND OF THE INVENTION

The present invention relates to a mounting system for mounting electronic assemblies on a printed circuit board, and particularly to a mounting system for successively mounting electronic assemblies on different printed circuit boards by one mounting line.

In a mounting system for mounting electronic assemblies on a printed circuit board, printed circuit boards are supplied one by one from a stocker with a number of printed circuit boards stored therein, and transported to a loader or a loading station. Then, a printed circuit board is transported to a mounting machine, and thereby electronic assemblies are attached onto the printed circuit board. The printed circuit board with the electronic assemblies mounted thereon is supplied to an unloader or an unloading station, and stored in a product stocker.

A typically mounting machine comprises an X-Y table for holding and moving a printed circuit board in the XY directions, an electronic assembly automatic attaching device for automatically attaching electronic assemblies on the printed circuit board supported by the X-Y table, and an inspection device for inspecting whether or not the electronic assembly is mounted on the predetermined position of the printed circuit board. The electronic assemblies mounted on the printed circuit board are soldered, and circuit devices are fabricated.

According to the conventional mounting system, one mounting line can handle one printed circuit board of one kind, and can fabricate circuit devices of one kind. When different circuit devices are fabricated on one mounting line, the mounting system is stopped temporarily in operation, and the process of the mounting line has to be modified, which is not economical from a time standpoint.

The stocker with the printed circuit boards stored therein can store printed circuit boards of one kind, and when different circuit devices are fabricated, the above stocker has to be exchanged to a stocker with different printed circuit boards stored therein.

Further, the conventional mounting system unavoidably produces half-finished products to cause an economical loss, which is not efficient. This defect with which the conventional mounting system encountered will be described below in detail. Let it now be assumed that four different printed circuit boards A, B, C, and D are each used to fabricate one electric product.

When N electric products are fabricated, N four kinds of the printed circuit boards A, B, C, D have to be fabricated. However, fabricated printed circuit boards contain defects, and hence the printed circuit boards A, B, C, D fabricated as finished-products in actual practice are $N_A$, $N_B$, $N_{C\ and\ ND}$ printed circuit boards A, B, C, D. The number of electric products that can be fabricated becomes equal to the minimum value of $N_A$, $N_B$, $N_C$, $N_D$ printed circuit boards A, B, C, D.

Also, let it be assumed that the minimum value of $N_A$, $N_B$, $N_C$, $N_D$ of the printed circuit boards A, B, C, D is $N_D$. Then, the number of electric products that can be fabricated is $N_D$. There are produced $N_A-N_D$ half-finished products for the printed circuit board A, $N_B-N_D$ half-finished products for the printed circuit board, and $N_C-N_D$ half-finished products for the printed circuit boards C. Finally, there are produced, in total, $N_A-N_D+N_B-N_D+N_C-N_D$ unfinished products.

SUMMARY OF THE INVENTION

In view of the aforesaid aspect, it is an object of the present invention to provide a mounting system in which circuit devices of many kinds can be mounted on printed circuit boards of many kinds efficiently from a time standpoint.

It is another object of the present invention to provide a mounting system in which, even when circuit devices of many kinds are mounted on printed circuit boards of many kinds, a loss of manufacturing cost caused by half-finished products can be minimized.

It is still another object of the present invention to provide a mounting system in which, even when circuit devices of many kinds are mounted on printed circuit boards of many kinds, mounting processes can be successively executed by one mounting line.

According to an aspect of the present invention, there is provided a mounting system including a loading station having a transport conveyor for conveying printed circuit boards, a mounting machine for mounting electronic assemblies on the printed circuit boards supplied thereto from the loading station, and an unloading station having a transport conveyor for unloading the printed circuit boards supplied thereto from the mounting machine. This mounting system comprises a discriminating device provided on the loading station for discriminating kinds or types of the printed circuit boards, wherein mounting processes in the mounting machine are selectively set in accordance with a discrimination signal from the discriminating device.

In accordance with another aspect of the present invention, there is provided a mounting method including steps of supplying a printed circuit board from a loading station to a mounting machine, attaching electronic assemblies on a printed circuit board by the mounting machine, and unloading the printed circuit board supplied from the mounting machine to an unloading station. This mounting method comprises the steps of generating a discrimination signal by discriminating kind or type of a printed circuit board in the loading station, and selectively setting a mounting process in the mounting machine in response to the discrimination signal.

BRIEF DESCRIPTION OF THE DRAWINGS

FIGS. 8A through 8E are perspective views showing examples of electronic assemblies;

FIGS. 12A to 12C are side views illustrating a manner in which electronic assemblies are attached to both surfaces of a printed circuit board.

DETAILED DESCRIPTION OF THE PREFERRED EMBODIMENT

A mounting system according to an embodiment of the present invention will be described with reference to FIG. 1.

Figure 1:
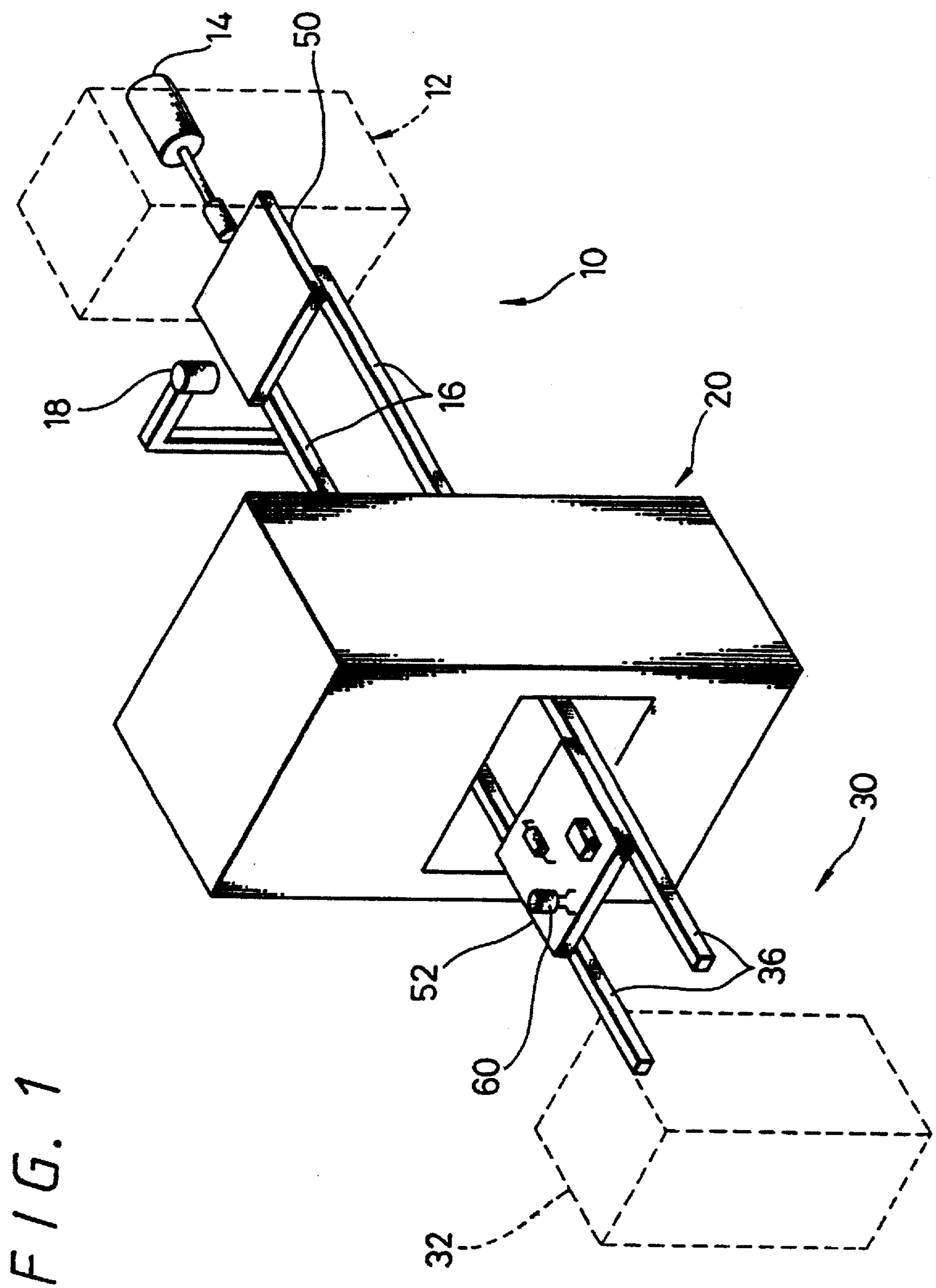
FIG. 1 is a schematic perspective view illustrating a mounting system according to an embodiment of the present invention.

As shown in FIG. 1, a mounting system according to the present invention includes a loader or loading station 10, a mounting machine 20, and an unloader or unloading station 30. The loading station 10 includes a discriminating device 18 for discriminating a printed circuit board 50.

A printed circuit board stocker 12 is located in the upper side of the loading station 10, and the stocker 12 stores therein many printed circuit boards 50 of many kinds.

The printed circuit board stocker 12 includes a suitable device for taking and supplying the printed circuit boards 50 one by one to the loading station 10, and such suitable device may be a pusher using a cylinder-like actuator 14.

The loading station 10 is typically,composed of a transport conveyor 16, and this transport conveyor 16 includes two parallel rail members. The printed circuit board 50 is supported and transported by these two rail members to the mounting machine 20.

The mounting machine 20 executes a mounting process. A printed circuit board 50 with a circuit device 52 mounted thereon is supplied to the unloading station 30. Typically, the unloading station 30 also is composed of a transport conveyor 36, and this transport conveyor 36 includes two parallel rail members.

A product stocker 32 for storing the printed circuit boards 50 with the circuit devices 52 mounted thereon is located in the lower side of the unloading station 30. The printed circuit board 50 is transported and conveyed by the transport conveyor 36 to the stocker 32.

The mounting process done by the mounting machine 20 includes a conveying process of the printed circuit boards 50, a positioning process, an electronic assembly attaching process, an inspection process, a process for ejecting the printed circuit board 50 with the circuit device 52 mounted thereon, etc.

The transport process of the printed circuit board 50 includes a process in which the printed circuit board 50 is conveyed from the loading station 10 to an X-Y table (see FIGS. 2 and 3) of the mounting machine 20, and the eject process of the printed circuit board 50 includes a process in which the printed circuit board 50 is ejected from the X-Y table of the mounting machine 20 to the unloading station 30. The transport process and the eject process of the printed circuit board 50 are executed by a printed circuit board conveying apparatus, not shown. Japanese Patent Application No. 5-74629 of the same assignee of this application describes an example of printed circuit board conveying apparatus.

When the mounting machine 20 includes a soldering apparatus, the mounting process includes a soldering process, and the printed circuit boards 52 ejected from the mounting machine 20 are the circuit devices which are finished-products. When the mounting machine 20 does not include the soldering apparatus, the printed circuit board 52 ejected from the mounting machine 20 is conveyed to the next soldering process.

The discriminating device 18 may be arranged in such a way as to detect a discrimination mark attached on the printed circuit board 50. Such discrimination mark includes an optical mark, a magnetic mark or the like. The optical mark includes a bar-code, a gray-code or the like, and the magnetic mark includes a magnetic code.

The discriminating device 18 may be arranged in such a way as to discriminate the printed circuit board 50 by an image-processing technique, instead of detecting the discrimination mark on the printed circuit board 50. The discriminating device 18 may be composed of an image-processing system including a video camera, a monitor apparatus, and an image recognition apparatus. When a picture of printed circuit board 50 is taken by the video camera, a video signal from the video camera is processed by the image recognition apparatus, and simultaneously supplied to the monitor apparatus.

The image recognition apparatus detects shape, outward form, size or the like of the printed circuit board 50, and discriminates type, kind or the like of the printed circuit board 50.

An operation of the mounting system according to the present invention will be described below.

As described above, the printed circuit board stocker 12 stores therein a number of printed circuit boards 50 of many kinds. If four kinds of printed circuit boards are each required to fabricate one electric product, the printed circuit board stocker 12 stores therein four kinds of printed circuit board of the same number in order.

When the actuator 14 is energized, the printed circuit board 50 is supplied from the printed circuit board stocker 12 to the transport conveyor 16. Before the printed circuit board 50 is supplied by the transport conveyor 16 to the mounting machine 20, the discrimination device 18 discriminates the printed circuit board 50. A discrimination signal from the discriminating device 18 is supplied to the mounting machine 20, and the mounting process is started.

The mounting machine 20 can execute a plurality of different mounting processes. According to the present invention, the mounting process is managed and controlled by a computer (not shown). This computer includes a plurality of programs corresponding to a plurality of mounting processes, and these programs correspond to the kinds of printed circuit board to be fabricated.

When the discrimination device 18 discriminates the printed circuit board 50, the discrimination signal is supplied to the computer, and the computer selects and starts a program in response to the discrimination signal supplied thereto. Thus, the mounting machine 20 executes a predetermined mounting process. The discrimination device 18 discriminates the next printed circuit board 50. When a discrimination signal different from the preceding one is supplied to the computer, the computer selects a program corresponding to other mounting process, whereby other mounting process is executed.

The printed circuit boards 50 with the circuit devices 52 mounted thereon are stored in the product storage member 32, and the printed circuit boards 52 may be stored in the product storage member 32 in the sequential order of being fabricated.

An example of an electronic assembly automatic attaching apparatus 200 included in the mounting machine 20 will be described with reference to FIG. 2.

Figure 2:
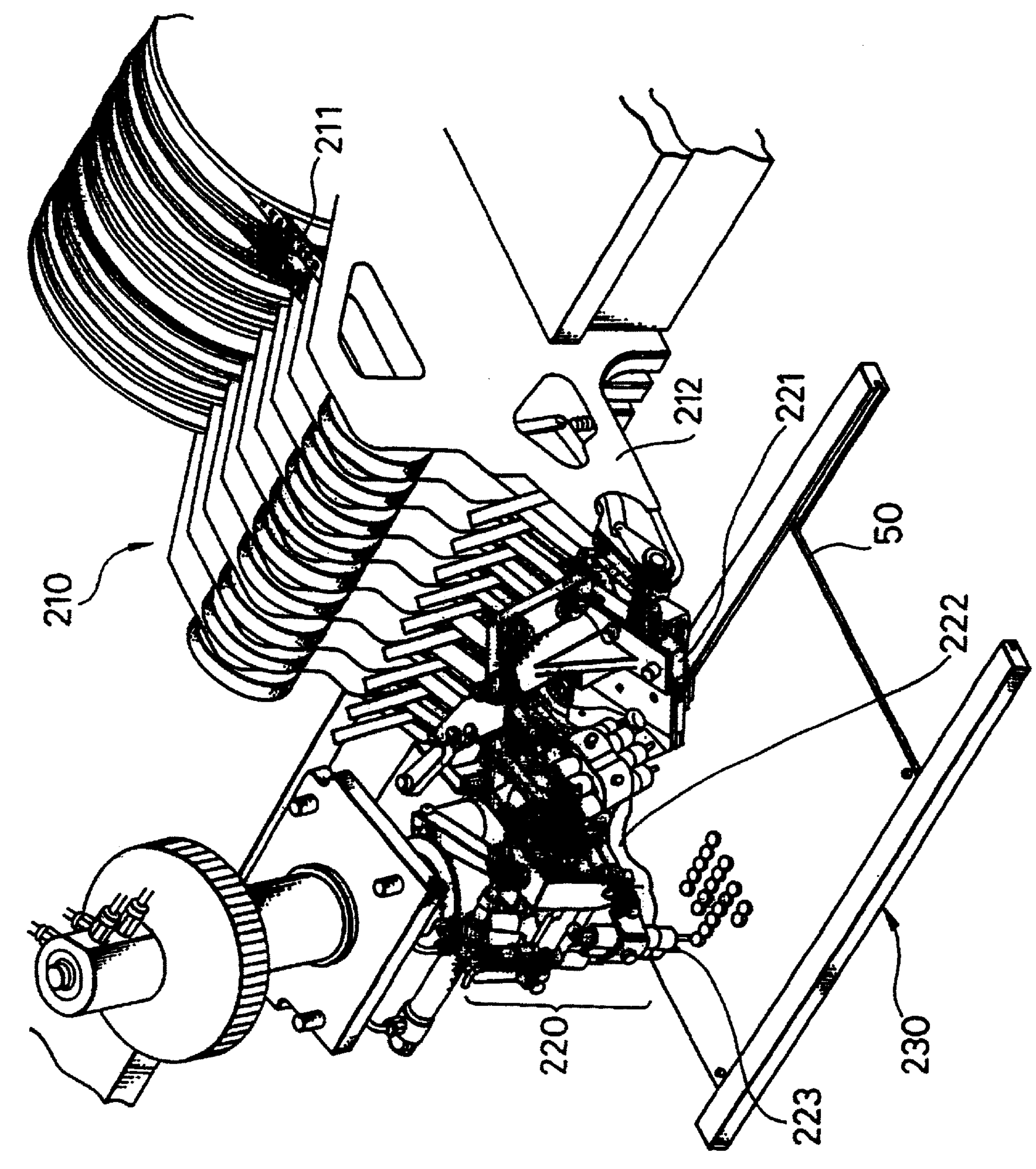
FIG. 2 is a fragmentary schematic perspective view illustrating an electronic assembly automatic attaching apparatus.

As shown in FIG. 2, the electronic assembly automatic attaching apparatus 200 includes an electronic assembly supplying apparatus 210 for successively supplying chip-type electronic assemblies, an attachment head 220 for adsorbing and conveying electronic assemblies to positioning positions on the printed circuit board 50, a positioning unit 221 for positioning electronic assemblies at positioning positions, and an X-Y table 230 for supporting the printed circuit board 50 such that the printed circuit board 50 can be moved in the XY directions.

The electronic assembly supplying apparatus 210 according to the present invention is of so-called carrier-tape system. In accordance with the carrier-tape system, electronic assemblies are attached at a constant interval to a long carrier-tape 211 which is wound around reels by taping. The carrier-tape 211 generally comprises two tapes, i.e., a top tape and a bottom tape, and electronic assemblies are held between the top tape and the bottom tape. A plurality of parts cassettes including such reels are loaded onto the electronic assembly supplying apparatus 210.

The electronic assembly supplying apparatus is not limited to the above carrier-tape system, and there is known other electronic assembly supplying apparatus of the type that electronic assemblies stored in a bulk case are supplied loose. The electronic assembly supplying apparatus for supplying electronic assemblies loose is often referred to as a "4bulk feeder" in which electronic assemblies are stored in plastic bulk cases, and such plastic bulk cases are loaded onto the electronic assembly supplying apparatus 210.

The attachment head 220 includes a rotary table 222 rotatable about a central axis and a plurality of adsorption nozzles 223. The adsorption nozzles 223 are attached to the circumferential direction of the rotary table 222, and the adsorption nozzles 223 are rotated in unison with a rotation of the rotary table 222. The adsorption nozzle 223 is moved among the adsorption position at which it adsorbs the electronic assembly supported to the carrier-tape 211, the positioning position at which the electronic assembly is positioned by the positioning unit 221, and the attachment position at which the electronic assembly is attached to the printed circuit board 50.

An operation of the electronic assembly automatic attaching apparatus according to this invention will be described.

Initially, the printed circuit board 50 is conveyed from the loading station 10 to the X-Y table 230. This conveying process is executed by the above suitable printed circuit board conveying apparatus (see Japanese Patent Application No. 5-74629). Then, the chip-type electronic assembly is adsorbed by the adsorption nozzle 223 located at the adsorption position, and the rotary table 222 is rotated, whereby the adsorption nozzle 223 is moved to the positioning position.

At the positioning position, the electronic assembly is located by the positioning unit 221. When the positioning of the electronic assembly is finished, the rotary table 222 is rotated and the adsorption nozzle 223 is moved to the attachment position. At the attachment position, the adsorption nozzle 223 is lowered to attach the thus adsorbed electronic assembly on the printed circuit board 50.

When the electronic assembly is attached on the printed circuit board 50, the X-Y table 230, is moved to the next attachment position. When this work is repeated and the attachment of all electronic assemblies is finished, the printed circuit board 50 is returned to the initial position. At the end, the printed circuit board 50 is ejected from the X-Y table 230 to the unloading station 30. The eject process of the printed circuit board 50 is executed by the above-mentioned printed circuit board conveying apparatus. A series of work is repeated.

The X-Y table 230 according to this invention and arrangement and operation of the positioning apparatus disposed in the X-Y table 230 will be described with reference to FIG. 3.

Figure 3:
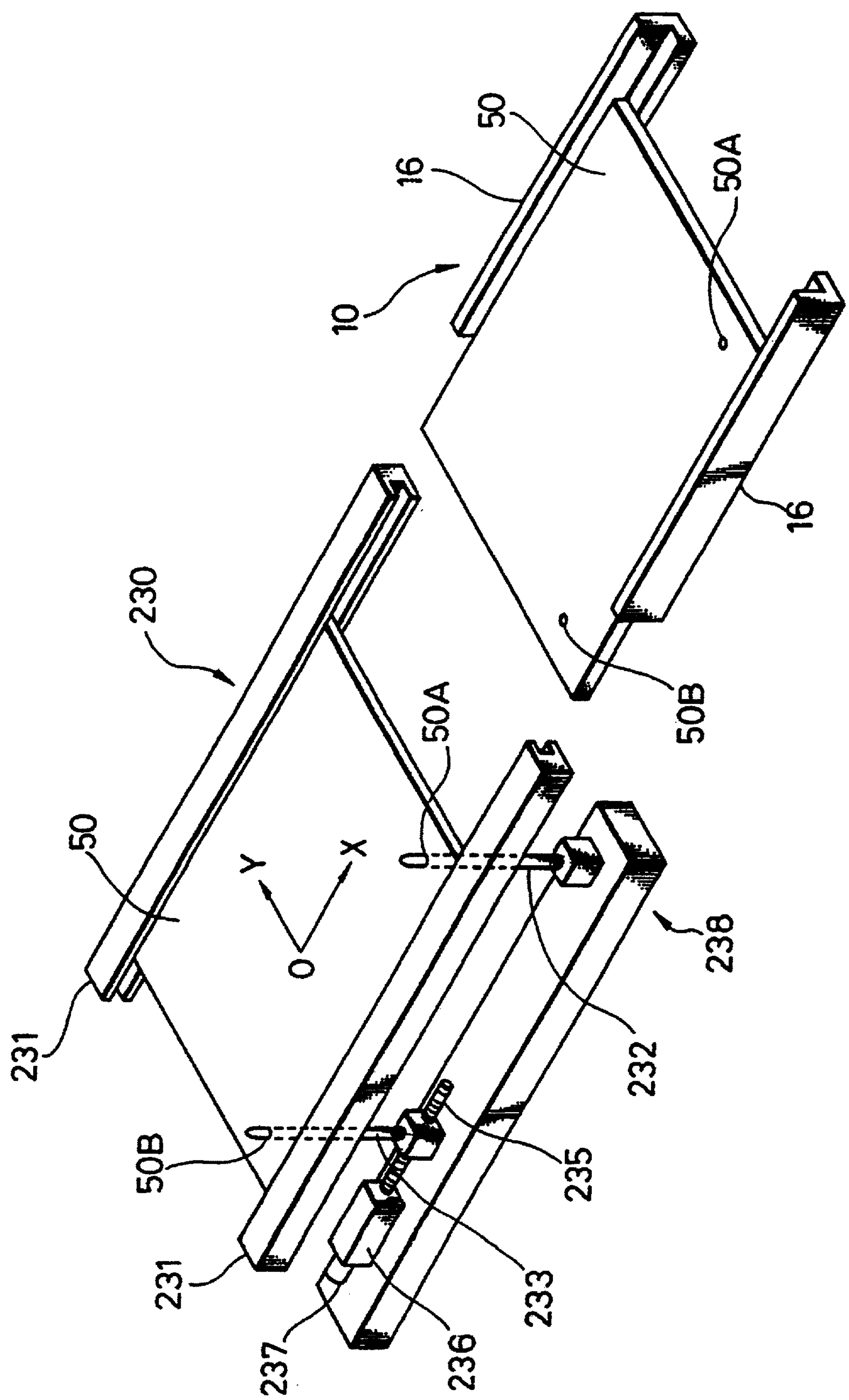
FIG. 3 is a schematic perspective view illustrating an X-Y table and a positioning mechanism.

As shown in FIG. 3, the X-Y table 230 includes two parallel rail members 231, 231. The positioning apparatus includes positioning pins 232, 233, a screw 235, a motor 236, an encoder 237, and a base 238. When the two positioning pins 232, 233 are engaged with positioning holes 50A, 50B defined on the printed circuit board 50, the printed circuit board 50 is positioned properly.

For the sake of simplicity, the X axis is set in parallel to the rail members 232, 233, and the Y axis is set in the direction perpendicular to the X axis on the horizontal plane as shown in FIG. 3. The base 238 is able to move in the vertical direction. When the base 238 is moved in the vertical direction, the two positioning pins 232, 233 are moved in the vertical direction. The first positioning pin 232 is fixed to the base 238.

The second positioning pin 233 can be moved relative to the base 238 in the X-axis direction. When the motor 236 is energized, the screw 235 is rotated, resulting in the second positioning pin 233 being moved in the X-axis direction. A moved amount of the positioning pin 233 is detected by the encoder 237.

Therefore, even when the kind of the printed circuit board 50 is different and the positions of the positioning holes 50A, 50B are different, the second positioning pin 233 is moved in the X-axis direction, whereby the two positioning pins 232, 233 can be engaged with the positioning holes 50A, 50B of the printed circuit board 50.

Operations of the X-Y table 230 and the positioning apparatus will be described below. A command signal is supplied to the positioning apparatus from the computer (not shown), and the position of the second positioning pin 233 is adjusted. After the position of the second positioning pin 233 is adjusted, the printed circuit board 50 is introduced from the transport conveyor 16 of the loading station 10 into the X-Y table 230 of the mounting machine 20.

Then, the base 238 is elevated, and the two positioning pins 232, 233 are engaged with the positioning holes 50A, 50B of the printed circuit board 50, thereby properly positioning the printed circuit board 50. Under the condition that the printed circuit board 50 is sandwiched between the two rail members 231, 231, the printed circuit board 50 can be freely moved in the X-axis direction and also can be moved a little in the Y-axis direction. Accordingly, the printed circuit board 50 can be accurately positioned in the X-axis direction and the Y-axis direction by the positioning apparatus.

A manner in which the printed circuit board is positioned properly by the positioning pins will be described with reference to FIGS. 4A, 4B and FIGS. 5A through 5D.

Figure 4B:
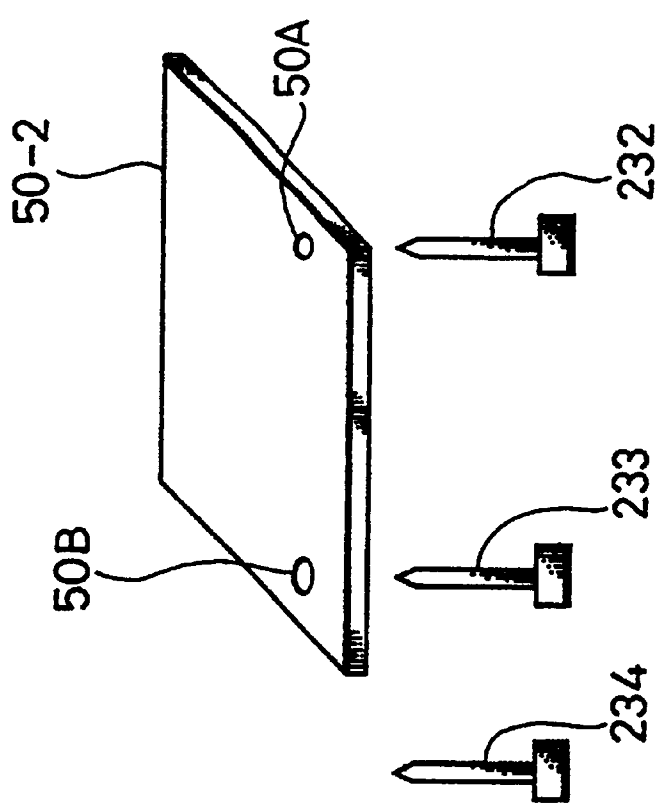
FIGS. 4A and 4B are schematic diagrams showing a relationship between positioning holes of a printed circuit board and positioning pins.
Figure 4A:
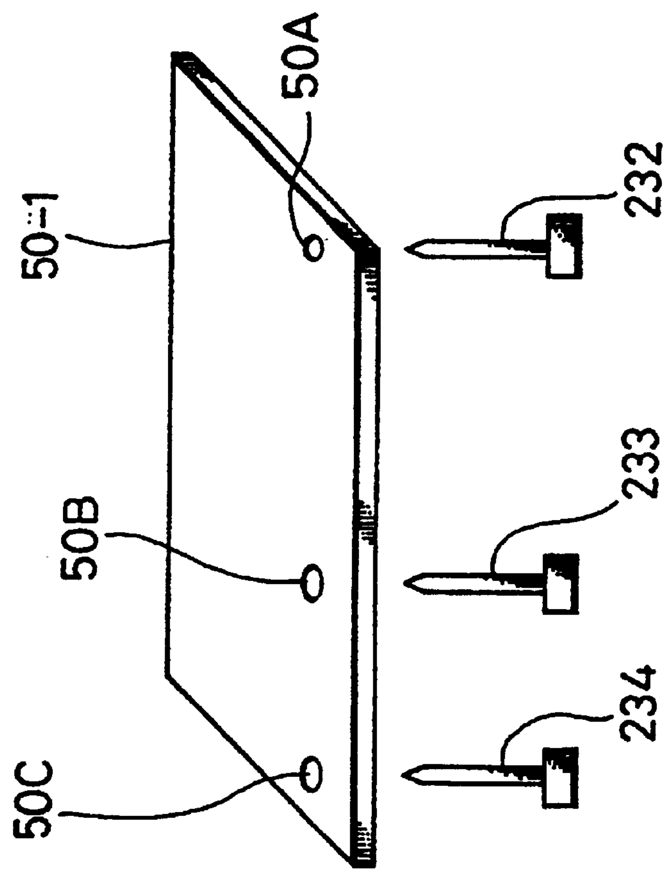

As shown in FIG. 4A, in the case of a relatively long printed circuit board 50-1, three positioning holes 50A, 50B, 50C are defined along the side edge of the printed circuit board 50-1. As shown in FIG. 4B, in the case of a relatively short printed circuit board 50-2, two positioning holes 50A, 50B are defined on the side edge of the printed circuit board 50-2. When the printed circuit board is properly positioned by a plurality of positioning holes, the printed circuit board is fixed so as not to be rotated.

The first positioning hole 50A is a circular hole and the second and third positioning holes 50B, 50C are oblong holes. As described above, the three positioning pins 232, 233, 234 are simultaneously elevated and engaged with the three positioning holes 50A, 50B, 50C, and the printed circuit board is properly positioned by the first positioning hole 50A which is the circular hole. If the second and third positioning holes 50B, 50C are shaped as oblong holes, then the printed circuit board to be positioned is allowed to slightly move in the X-axis direction.

An origin O of coordinates is set at the center of the first positioning hole 50A disposed on the leftmost end. Electronic assembly attaching positions on the printed circuit boards 50-1, 50-2 are expressed by XY coordinates calculated from such origin O.

The positioning apparatus may be provided with three positioning pins 232, 233, 234. The first positioning pin 232 is fixed to the base 238 similarly to the first positioning pin 232 shown in FIG. 3, and the second and third positioning pins 233, 234 can be adjusted in position in the X-axis direction similarly to the second positioning pin 233 shown in FIG. 3.

Figure 6A:
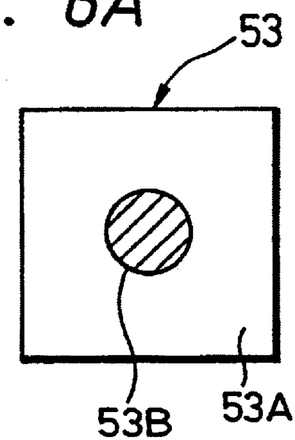
FIGS. 6A through 6D are schematic diagrams showing examples of alignment marks attached on the printed circuit board.
Figure 6B:
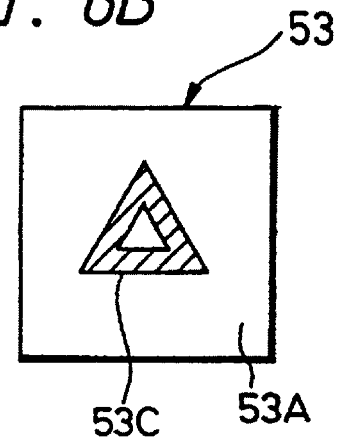

The relatively long printed circuit board 50-1 and the relatively short printed circuit board 50-2 may, of course, include the two positioning holes 50A, 50B, and the positioning circuit board 50. A manner in which the position of the printed circuit board is determined under the condition that positioning holes are not defined on the printed circuit board will be described with reference to FIGS. 6A through 6D. In that case, an alignment mark is generally attached to the printed circuit board 50. In the example of an alignment mark 53 shown in FIG. 6A, a circular copper foil 53B with an outer diameter of about 1 mm is attached to a square transparent mount 53A whose one side is 3 to 4 mm. In an example of an alignment mark 53 shown in FIG. 6B, a triangular copper foil 53C whose one side is about 2 mm is attached to a square transparent mount 53A whose one side is about 4 to 5 mm.

Figure 6C:
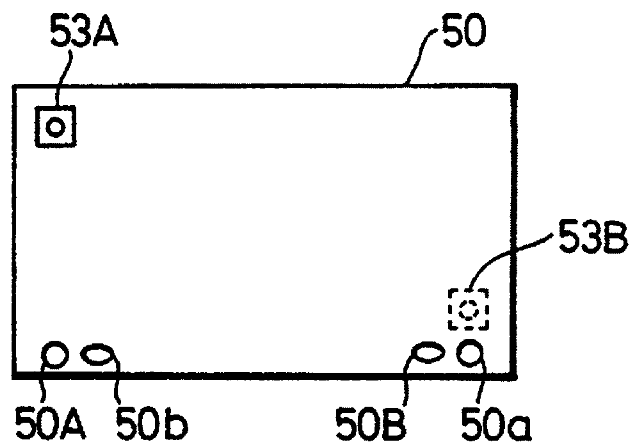
Figure 6D:
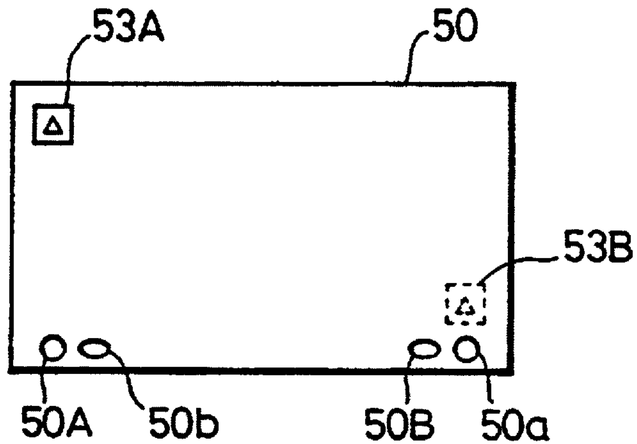

As shown in FIGS. 6C and 6D, the alignment mark 53 is attached to the side edge of the printed circuit board 50 similarly to the positioning holes. If the printed circuit board 50 has to be turned over, then the alignment mark 53 is attached to both surfaces of the printed circuit board 50. The alignment mark 53 is detected by a suitable detecting device. If the detecting device detects that the alignment mark 53 is accurately placed at the predetermined position, then the positioning of the printed circuit board 50 is finished.

An example of the printed circuit board stocker 12 will be described with reference to FIG. 7.

Figure 7:
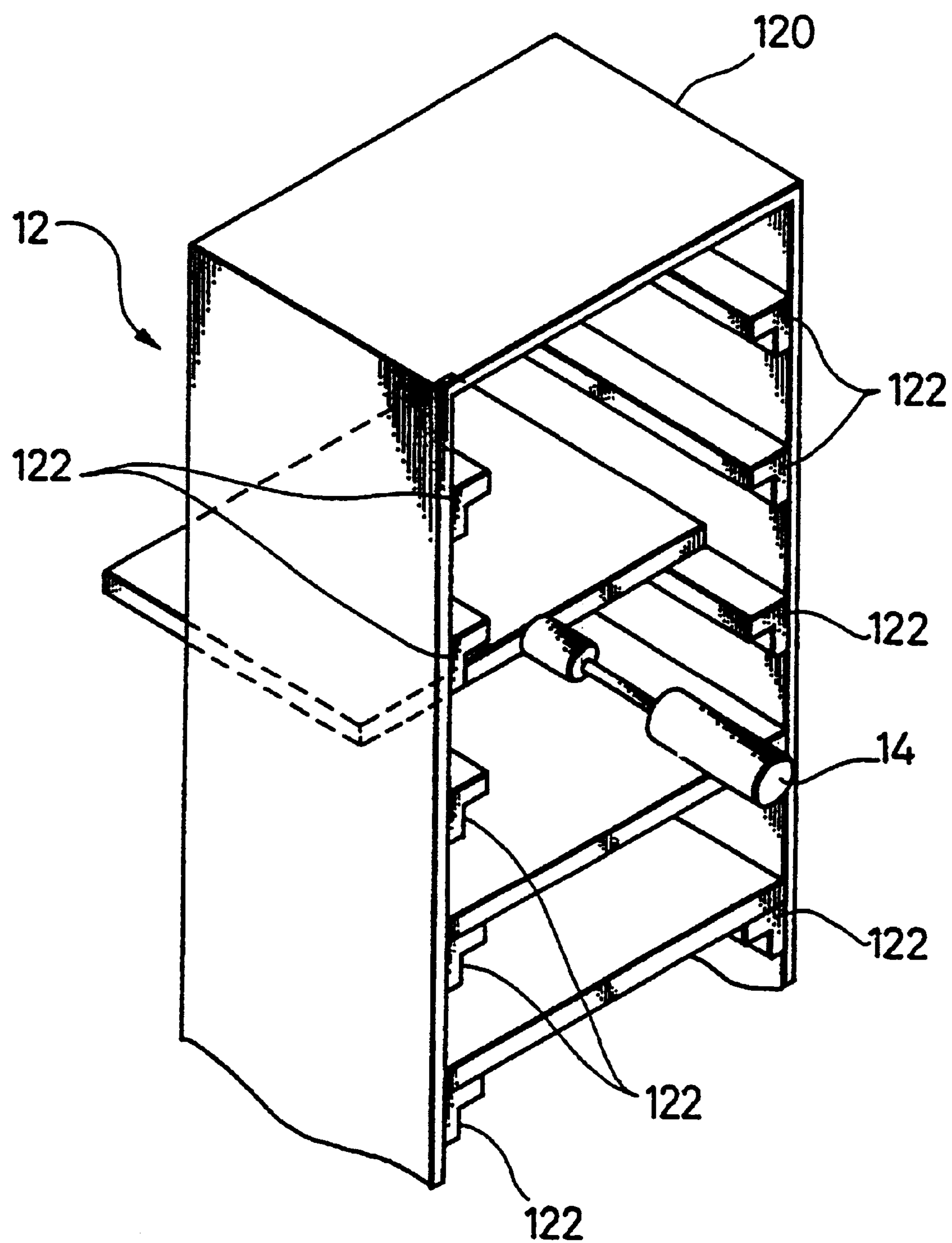
FIG. 7 is a perspective view illustrating an example of a stocker used in the mounting system according to the present invention.

As shown in FIG. 7, the printed circuit board stocker 12 according to the present invention includes a box 120 whose front and back surfaces are opened, and an actuator 14 disposed on the rear portion of the box 120. A plurality of rack members apparatus may include the two positioning pins 232, 233.

Figure 5A:
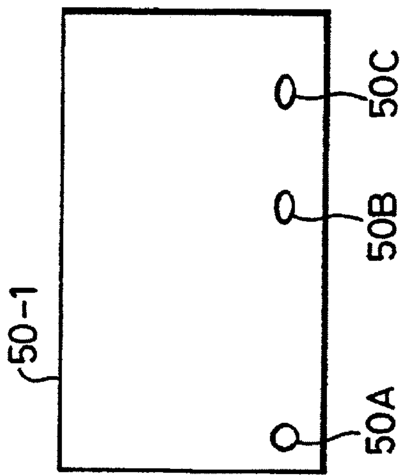
FIGS. 5A through 5D are schematic diagrams showing examples of positioning holes of a printed circuit board.

In the example shown in FIG. 5A, the relatively long printed circuit board 50-1 is properly positioned by the three pins 232, 233, 234. In the example shown in FIG. 5C, the relatively short printed circuit board 50-2 may be properly positioned by the two positioning pins 232, 233.

Figure 5B:
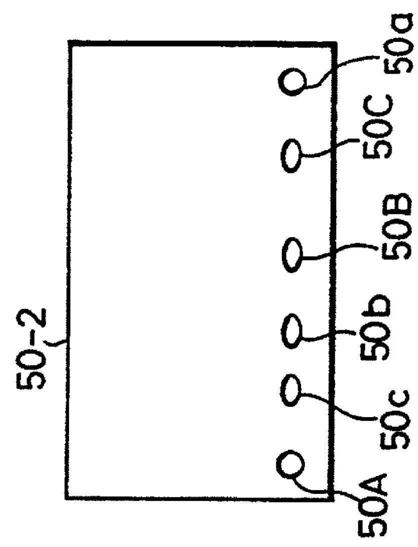
Figure 5C:
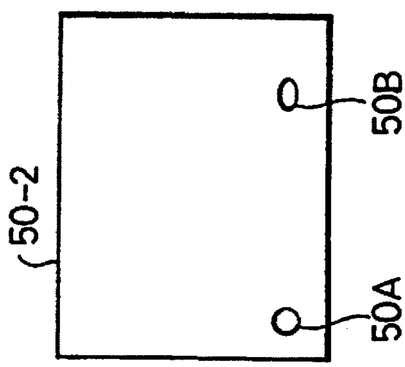
Figure 5D:
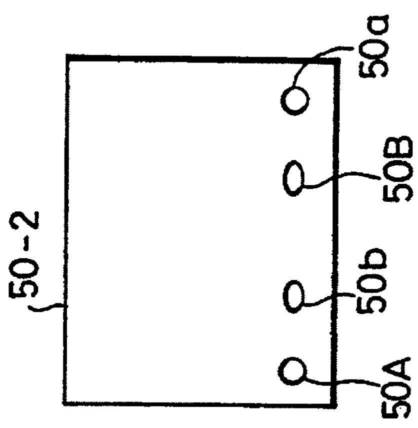

FIGS. 5A, 5C show examples of the printed circuit board 50 which need not be turned over in the mounting process. In the case of the printed circuit board 50 that has to be turned over in the mounting process, positioning holes have to be defined on the printed circuit board 50 separately. As shown in FIG. 5B, in the case of the printed circuit board 50-2 with the three positioning holes defined thereon, positioning holes 50*a*, 50*b*, 50*c* used when electronic assemblies are mounted on the second surface are defined on the printed circuit board 50-2 in addition to positioning holes 50A, 50B, 50C used when electronic assemblies are mounted on the first surface. As shown in FIG. 5D, in the case of:the printed circuit board 50-2 with two positioning holes defined thereon, positioning holes 50*a*, 50*b* used when electronic assemblies are mounted on the second surface are defined on the printed circuit board 50-2 in addition to the positioning holes 50A, 50B used when electronic assemblies are mounted on the first surface.

While a manner in which the position of the printed circuit board is determined by use of the positioning holes defined on the printed circuit board 50 have been described so far, positioning holes are not always defined on the printed 122 are disposed on the inner surfaces of side plates of both sides of the box 120, and the printed circuit boards 50 are disposed on the upper side of the rack members 122. In this manner, the printed circuit boards 50 are disposed in parallel and distant from each other within the printed circuit board stocker 12 such that they are stacked in the vertical direction.

The printed circuit boards 50 are unloaded one by one from the stocker 12 above by the actuator 14. When the actuator 14 is energized, one printed circuit board 50 is pushed forwardly by the tip end of the piston of the actuator 14, and disposed on the loading station 10. Each time one printed circuit board 50 is pushed, the stocker 12 is moved in the upper direction, and placed at the position in which the next printed circuit board 50 is supposed to be pushed forwardly by the tip end of the piston of the actuator 14.

As described above, the printed circuit boards 50 of different kinds are disposed on the printed circuit board stocker 12 from above in a predetermined sequential order. According to the printed circuit board stocker 12 of the present invention, the printed circuit boards of different kinds are supplied to the loading station 10 in a predetermined sequential order.

The kinds of the printed circuit boards 50 and the mounted printed circuit boards 52 will be described below. The mounting system according to the present invention can execute different mounting processes by the one mounting machine 20 or one mounting line. A different printed circuit board 50 is used for each different printed circuit board 52 to be fabricated, and an electronic assembly that is to be attached to the printed circuit board 52 to be fabricated also is different.

FIGS. 8A through 8E show examples of electronic assemblies to be attached on the printed circuit board 50. FIGS. 8A to 8C show examples of electronic assemblies with lead wires, and FIGS. 8D and 8E show examples of chip-type electronic assemblies. The electronic assembly with lead wire includes a lead wire, and the chip-type electronic assembly includes a leader portion instead of the lead wire.

An electronic assembly with lead wire 61 shown in FIG. 8A is often referred to as a "radial type", and a lead wire 61B is elongated from one end face of a body 61A in the radial direction. An electronic assembly with lead wire 62 shown in FIG. 8B is often referred to as an "axial type", and a lead wire 62B is elongated from both end faces of a body 62A in the axial direction. FIG. 8C shows a jumper wire 63.

A chip-type electronic assembly 64 shown in FIG. 8D includes a planar lead portion 64B covering both end portions of a body 64A, and a chip-type electronic assembly 65 shown in FIG. 8E includes slip-like lead portions 65B elongated from both sides of a body 65A.

Figure 9A:
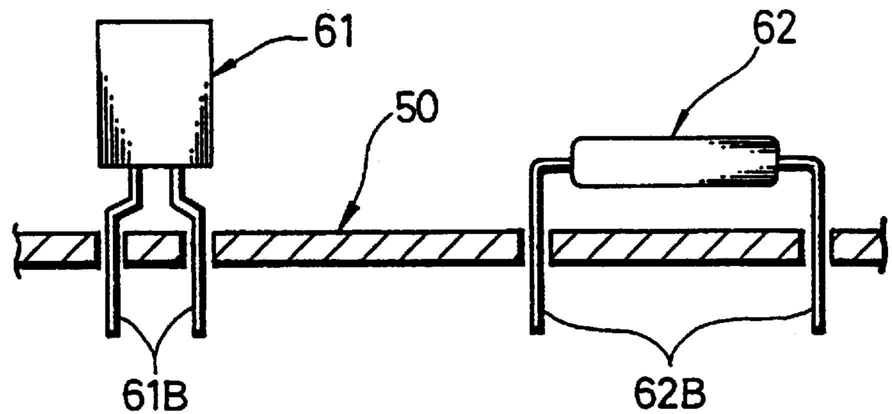
FIGS. 9A to 9C are side views illustrating a soldering process (dipping) of electronic assembly with a leader.
Figure 9B:
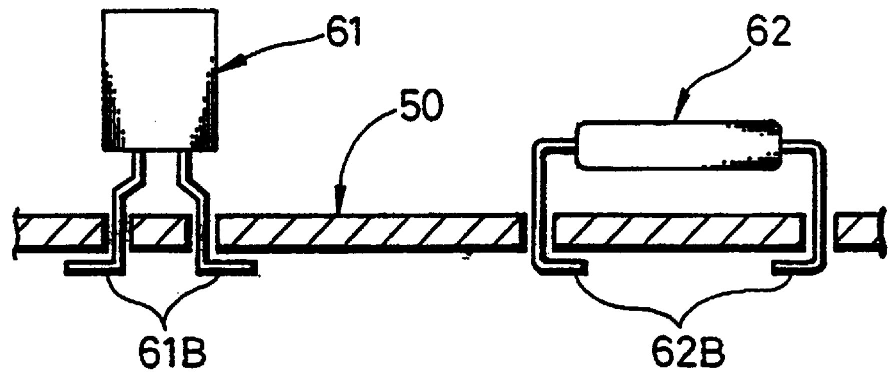

A manner in which the electronic assemblies 61. 62 with lead wires are attached to the printed circuit board 50 will be described with reference to FIGS. 9A to 9C. The electronic assemblies 61, 62 with lead wires are generally soldered by dipping. As shown in FIG. 9A, the electronic assemblies 61, 62 with lead wires are disposed on one surface of the printed circuit board 50. The lead wires 61B, 62B are inserted into holes 50A of the printed circuit board 50, and the tip ends of the lead wires 61B, 62B are protruded to the back surface side of the printed circuit board 50. Then, the tip ends of the lead wires 61B, 62B are bent as shown in FIG. 9B.

Figure 9C:
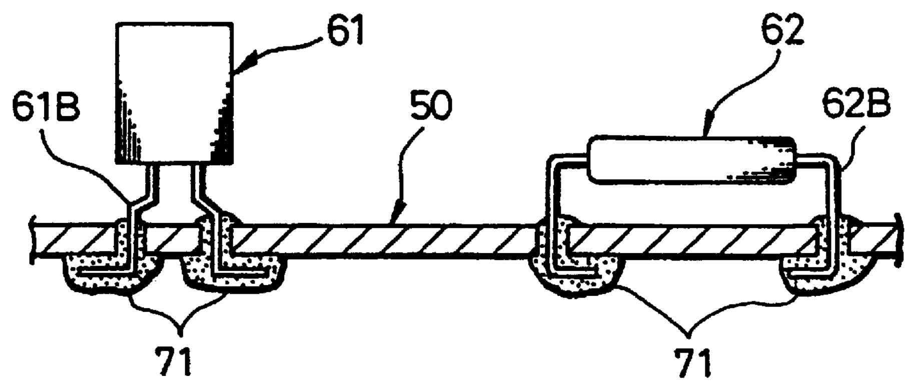

Finally, as shown by reference numerals 71 in FIG. 9C, the lead wires 61B, 62B are soldered by dipping. According to dipping, jet flow of fused solder is produced in a solder bath. When the printed circuit board 50 with its back surface in contact with the jet flow of fused solder is moved, the lead wires 61B, 62B are soldered.

Figure 10A:
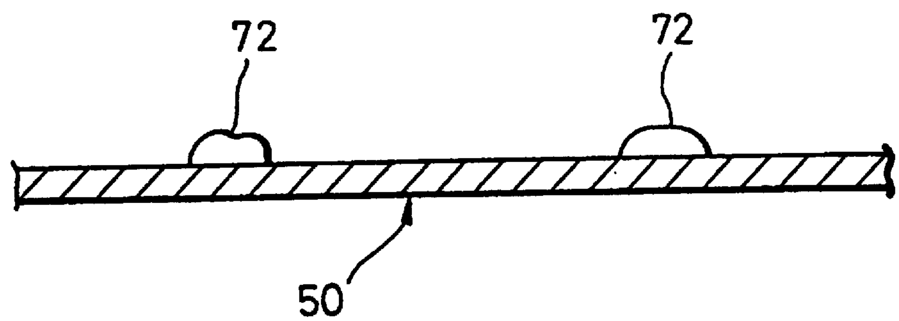
FIGS. 10A to 10C are side views illustrating a soldering process (dipping) of chip-type electronic assembly.
Figure 10B:
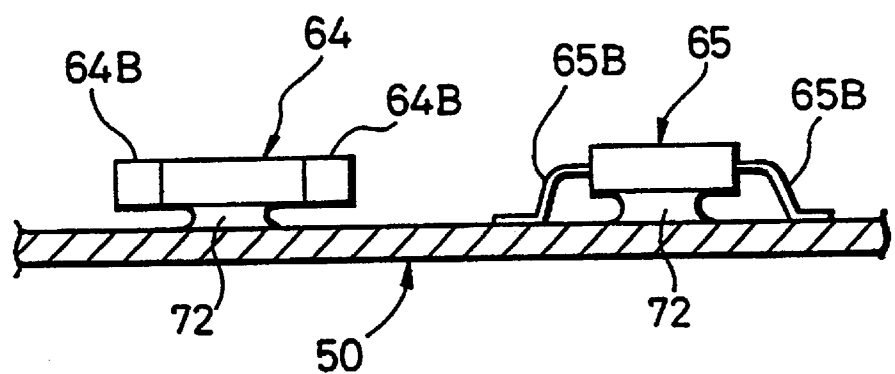
Figure 10C:
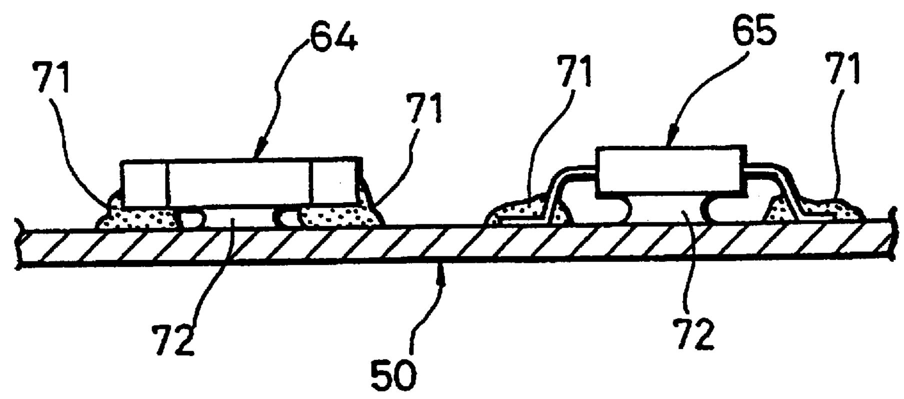
Figure 11A:
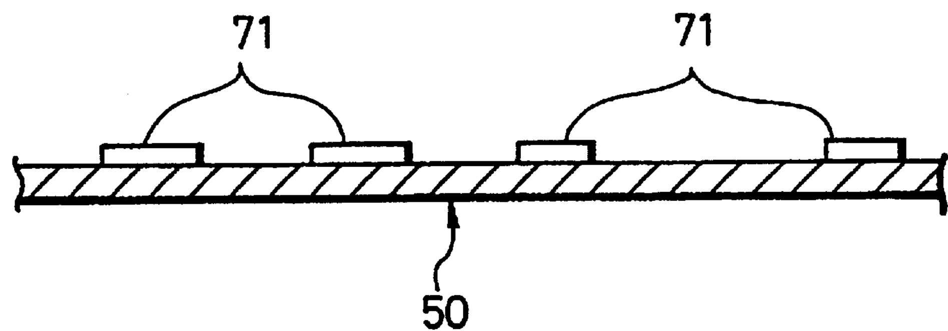
FIGS. 11A to 11C are side views illustrating a soldering process (reflowing) of chip-type electronic assembly.
Figure 11B:
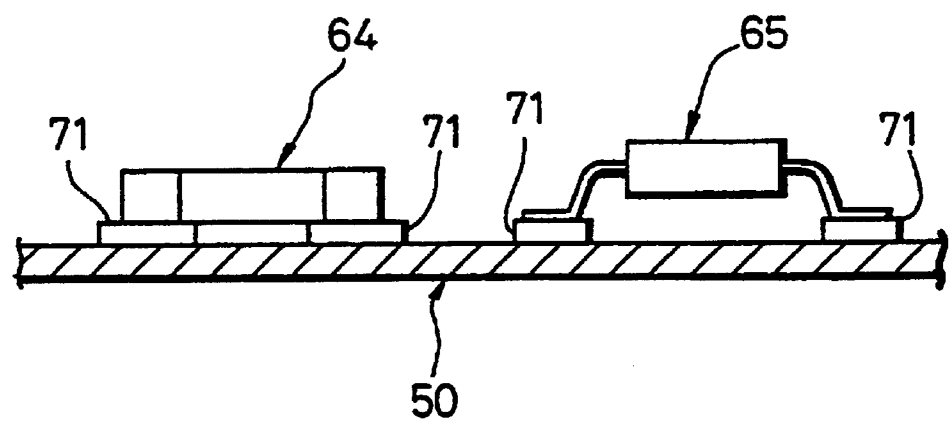
Figure 11C:
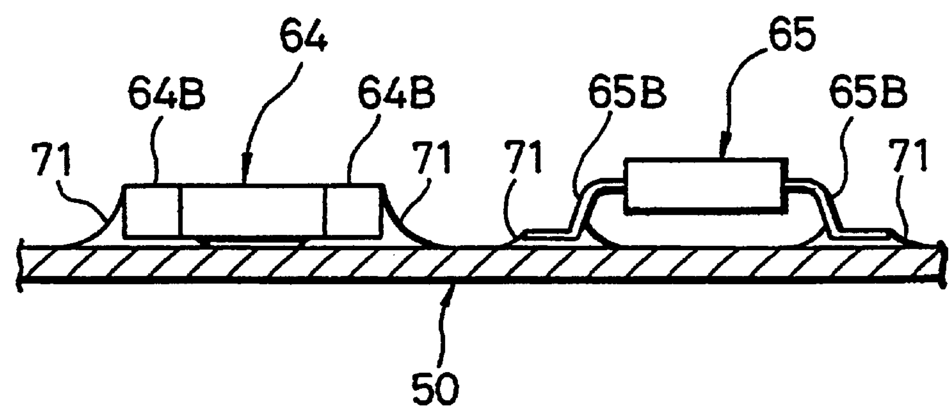

A manner in which the chip-type electronic assemblies 64, 65 are attached to the printed circuit board 50 will be described with reference to FIGS. 10A to 10C and FIGS. 11A to 11C. FIGS. 10A to 10C show dipping, and FIGS. 11A to 11C show reflow soldering. Initially, dipping will be described with reference to FIGS. 110A to 110C. As shown in FIG. 10A, adhesives 72 are coated on the surface of the printed circuit board 50. Then, as shown in FIG. 10B, the chip-type electronic assemblies 64, 65 are disposed on the adhesives 72. The printed circuit board 50 is heated by a curing furnace, and the adhesives 72 are cured, resulting in the chip-type electronic assemblies 64, 65 being fixed. Finally, as shown by reference numerals 71 in FIG. 10C, the lead portions 64B, 65B are soldered by dipping.

Reflow soldering will be described with reference to FIGS. 11A to 11C. Initially, as shown in FIG. 11A, cream-like solders 71 of proper shape are coated on the surface of the printed circuit board 50. The solders 71 are coated on the surface of the printed circuit board 50 by screen deposition. Then, as shown in FIG. 11B, the chip-type electronic assemblies 64, 65 are disposed on the solders 71, and the printed circuit board 50 with the chip-type electronic assemblies 64, 65 disposed thereon is introduced into a reflow soldering furnace. The cream-like solders are fused in the reflow soldering furnace, and the lead portions 64B, 65B are soldered as shown by reference numerals 71 in FIG. 11C.

The kinds of electronic assemblies and the kinds of the mounting processes and the soldering processes will be described with reference to FIGS. 9A to 9C, FIGS. 10A to 10C, FIGS. 11A to 11C and FIGS. 12A to 12C. As described above, the electronic assembly with lead wire and the chip-type electronic assembly are now available as electronic assemblies. The electronic assembly with lead wire is attached to one surface of the printed circuit board 50, and the chip-type electronic assembly can be attached to one or both surfaces of the printed circuit board 50. The electronic assembly with lead wire is soldered by dipping, and the chip-type electronic assembly is soldered by reflow soldering.

Each surface of the printed circuit board 50 is soldered by either dipping or reflow soldering. The types of soldering processes are classified as follows:

(1) Single-sided Dipping

Only one surface of the printed circuit board 50 is soldered by dipping, and the other surface is not soldered. Like the examples shown in FIGS. 9A to 9C and FIGS. 10A to 10C, the electronic assembly with lead wire or the chip-type electronic assembly is attached to only one surface of the printed circuit board 50. Alternatively, as shown in FIG. 12A, the electronic assembly with lead wire is attached to one surface of the printed circuit board 50 and the chip-type electronic assembly is attached to the other surface of the printed circuit board 50.

(2) Single-sided Reflow Soldering

As shown in FIGS. 11A to 11C, the chip-type electronic assembly is soldered on only one surface of the printed circuit board 50 by reflow soldering, and the other surface is not soldered.

(3) Single-sided Dipping/Single-sided Reflow Soldering

As shown in FIG. 12B, the chip-type electronic assembly and the electronic assembly with lead wire are soldered on one surface of the printed circuit board 50 by dipping, and the chip-type electronic assembly is soldered to the other surface by reflow soldering.

(4) Double-sided Reflow Soldering

As shown in FIG. 12C, the chip-type electronic assemblies are soldered to both surfaces of the printed circuit board 50 by reflow soldering.

The single-sided dipping and the single-sided reflow soldering include one soldering process, and the single-sided dipping/single-sided reflow soldering and the double-sided reflow soldering include two soldering processes.

When the electronic assembly with lead wire or the chip-type electronic assembly is attached to only one surface of the printed circuit board 50 by single-sided dipping as shown in FIGS. 9A to 9C and FIGS. 10A to 10C, the printed circuit board 50 need not be turned over. In the case of single-sided reflow soldering, the printed circuit board 50 need not be turned over.

When the electronic assembly with lead wire is attached on one surface of the printed circuit board 50 and the chip-type electronic assembly is attached on the other surface of the printed circuit board 50 by single-sided dipping as shown in FIG. 12A, the printed circuit board 50 has to be turned over. Also in the case of double-sided reflow soldering, the printed circuit board 50 has to be turned over.

An example of a mounting process will be described with reference to a flow chart of FIG. 13. This mounting process treats the case of single-sided dipping shown in FIG. 12A, i.e., the electronic assembly with lead wire is attached on one surface of the printed circuit board 50 and the chip-type electronic assembly is attached on the other surface of the printed circuit board 50.

Figure 13:
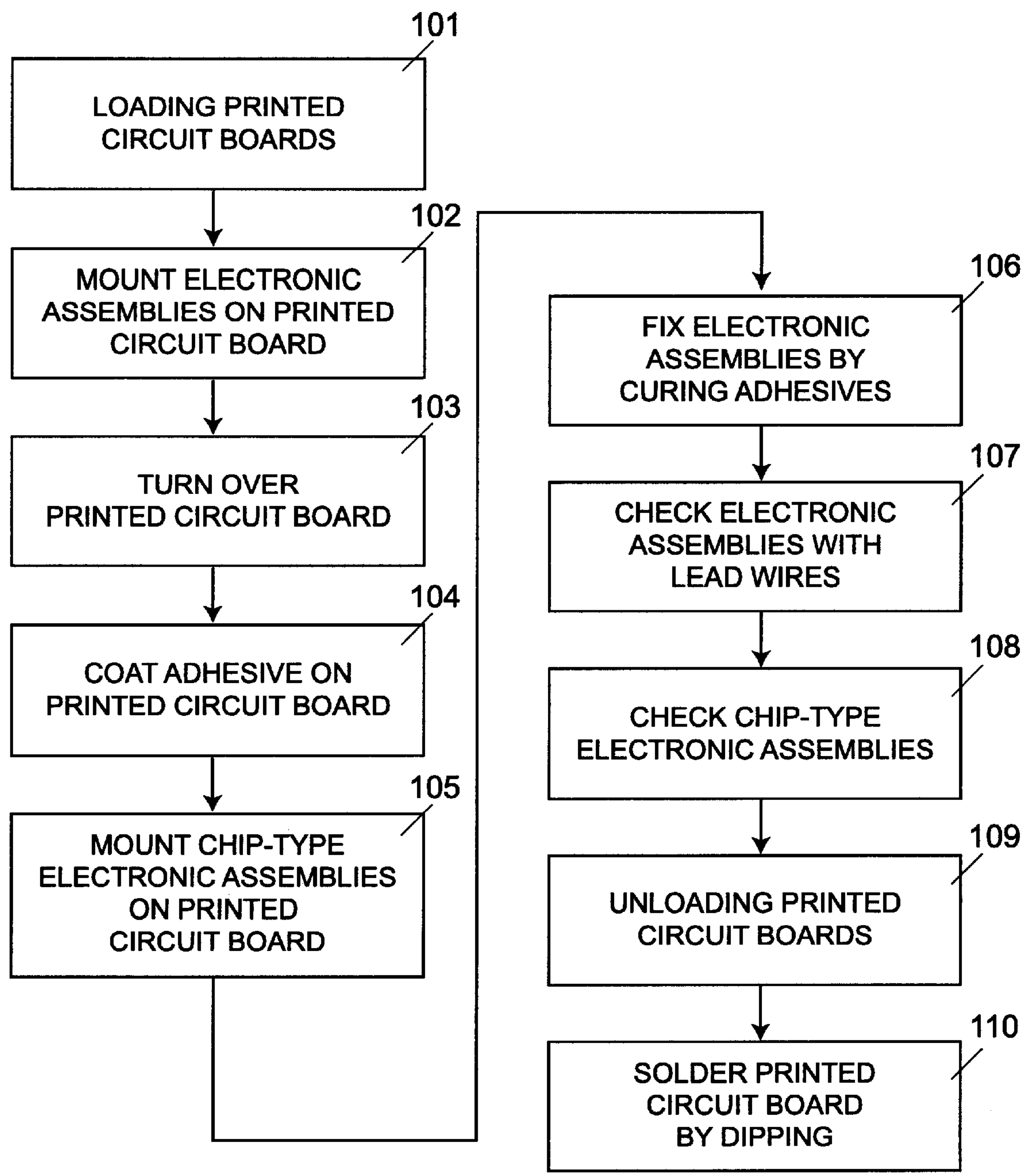
FIG. 13 is a flow chart to which reference will be made in explaining an example of a mounting process.

Referring to FIG. 13, at step 101, the printed circuit board 50 is introduced into the mounting machine or the mounting line, and this process is referred to as a “loading”. In step 102, electronic assemblies 61, 62 with lead wires are attached on one surface (first surface) of the printed circuit board 50, and this process is automatically executed by the electronic assembly attaching apparatus. As earlier noted with reference to FIG. 9B, the tip ends of the lead wires 61B, 62B that have been protruded to the opposite side (second surface) of the printed circuit board 50 are bent, thereby the electronic assemblies 61, 62 being fixed.

At step 103, the printed circuit board 50 is turned over, and adhesives 72 are coated on the other surface (second surface) of the printed circuit board 50 at step 104. In step 105, the chip-type electronic assemblies 64, 65 are disposed on the adhesives 72. At step 106, the adhesives 72 are cured, and the adhesives 72 are cured in the furnace. After the adhesives 72 have been cured as described above, the chip-type electronic assemblies 64, 65 are fixed on the printed circuit board 50.

At the end, the electronic assemblies 61, 62 with lead wires and the chip-type electronic assemblies 64, 65 attached on the printed circuit board 50 are inspected at steps

107, 108. When the above electronic assemblies 64, 65 are inspected, the printed circuit board 50 need not be turned over, and the surface (second surface) with the chip-type electronic assemblies 64, 65 mounted thereon is inspected. When the electronic assemblies 61, 62 with lead wires are inspected, the lead wires 61B, 62B that have been protruded to the surface (second surface) with the chip-type electronic assemblies 64, 65 mounted thereon are inspected.

In general, the following items are to be inspected:

(a) Defect

Electronic assembly is not attached to a predetermined position.

(b) Attached with Displacement

Although electronic assembly is mounted, it is attached to the position displaced from the predetermined position.

(c) Inverted Mounting

Chip-type electronic assemblies are mounted on the printed circuit board inside-out.

(d) Bridge

Solders formed bridge.

(e) Vertical Mounting

Electronic assemblies, in particular, chip-type electronic assemblies are vertically mounted on the printed circuit board.

(f) Rotation Mounting

Electronic assemblies are not directed in a predetermined rotational direction.

At the completion of inspection processes 107, 108, the processing proceeds to the next unloading step 109, whereat the printed circuit board 50 is conveyed by the electronic assembly attachment apparatus to the next soldering apparatus for soldering electronic assemblies by dipping.

According to the present invention, the mounting process is controlled by the computer, and predetermined softwares are selected, and executed. The selected softwares include processes wherein electronic assemblies are attached on the printed circuit board 50 and inspected, as earlier noted with reference to FIGS. 8A through 8E to FIG. 13. There are various types of electronic assemblies as shown in FIGS. 8A through 8E, and these electronic assemblies are soldered by dipping or reflow soldering. Furthermore, the inspection includes the above-mentioned items.

According to the present invention, any kinds of printed circuit boards can be successively and simultaneously fabricated from many kinds of printed circuit boards by one mounting machine or one mounting line.

Further, according to the present invention, since many kinds of printed circuit boards can be successively fabricated from many kinds of printed circuit boards without ceasing the mounting machine or the mounting line, it is possible to provide a mounting process with high efficiency from a time standpoint.

Furthermore, since many kinds of printed circuit boards can be successively simultaneously fabricated from many kinds of printed circuit boards, the number of work half done can be minimized, and hence a loss of manufacturing cost can be minimized.

Having described preferred embodiments of the invention with reference to the accompanying drawings, it is to be understood that the invention is not limited to those precise embodiments and that various changes an modifications could be effected therein by one skilled in the art without departing from the spirit or scope of the invention as defined in the appended claims.

What is claimed is:

1. A mounting system including a loading station having a transport conveyor for successively conveying printed circuit boards of differing kinds or types, a mounting machine providing a mounting process for mounting electronic assemblies on said printed circuit boards supplied thereto from said loading station, and an unloading station having a transport conveyor for ejecting said printed circuit boards supplied thereto from said mounting machine, wherein said loading station includes a discriminating device for discriminating the kinds or types of said successively conveyed printed circuit boards based upon a magnetic mark applied to the respective printed board and issues a discriminating signal prior to the mounting process to selectively set a type of mounting process for electronic assemblies to be mounted on a respective printed circuit board by the mounting machine during the mounting process.

2. The mounting system as claimed as in claim 1, wherein said discriminating device discriminates said printed circuit boards by detecting a discrimination mark attached to said printed circuit board.

3. The mounting system as claimed in claim 1 wherein said mounting process is controlled by a computer, a predetermined software is selected by said discrimination signal from said discriminating device, and said mounting machine is energized by said selected software.

4. The mounting machine as claimed in claim 1 wherein said mounting process include a positioning process for positioning a printed circuit board, a process for attaching electronic assemblies on said printed circuit board, and a process for inspecting electronic assemblies.

5. A mounting system including a loading station having a transport conveyor for successively conveying printed circuit boards of different kinds or types, a mounting machine providing a mounting process for mounting electronic assemblies on said printed circuit boards supplied thereto from said loading station, and an unloading station having a transport conveyor for ejecting said printed circuit boards supplied thereto from said mounting machine, wherein said l discriminating device for discriminating the kinds or types of said successively conveyed printed circuit boards by means of an image processing system which detects an exterior characteristic of the respective printed circuit board and issues a discriminating signal prior to the mounting process to selectively set the mounting processes to be successively executed for mounting a variety of electronic assemblies on a respective printed circuit board by the mounting machine during the mounting process.

* * * * *